US012620444B2

(12) United States Patent
Song et al.

(54) OPERATION METHOD FOR THREE-DIMENSIONAL FLASH MEMORY INCLUDING FERROELECTRIC-BASED DATA STORAGE PATTERN AND BACK GATE

(71) Applicant: IUCF-HYU (INDUSTRY-UNIVERSITY COOPERATION FOUNDATION HANYANG UNIVERSITY), Seoul (KR)

(72) Inventors: Yun Heub Song, Seoul (KR); Jea Min Shim, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 125 days.

(21) Appl. No.: 18/798,572

(22) Filed: Aug. 8, 2024

(65) Prior Publication Data

US 2024/0404602 A1    Dec. 5, 2024

Related U.S. Application Data

(63) Continuation of application No. PCT/KR2023/000995, filed on Jan. 20, 2023.

(30) Foreign Application Priority Data

Feb. 11, 2022    (KR) ........................ 10-2022-0017916

(51) Int. Cl.
*G11C 16/10*          (2006.01)
*G11C 11/22*          (2006.01)
(Continued)

(10) Patent No.:    US 12,620,444 B2
(45) Date of Patent:         May 5, 2026

(52) U.S. Cl.
CPC ............ *G11C 16/102* (2013.01); *G11C 11/22* (2013.01); *G11C 11/223* (2013.01);
(Continued)

(58) Field of Classification Search
CPC ..... G11C 16/102; G11C 11/22; G11C 11/223; G11C 11/2275; G11C 11/5657;
(Continued)

(56) References Cited

U.S. PATENT DOCUMENTS 9,805,807 B2 * 10/2017 Lee ........................ G11C 16/16
10,210,921 B1 * 2/2019 Hwang ............... G11C 11/2257
(Continued)

FOREIGN PATENT DOCUMENTS

KR     10-2014-0086599 A     7/2014
KR     10-2017-0019541 A     2/2017
KR     10-2017-0093099 A     8/2017

OTHER PUBLICATIONS

International Search Report issued from the WIPO dated Apr. 28, 2023 for the PCT International Application No. PCT/KR2023/000995.

(Continued)

*Primary Examiner* — Donald HB Braswell

(57)          ABSTRACT

Disclosed is an operation method for a three-dimensional flash memory including a ferroelectric-based data storage pattern and a back gate. According to an embodiment, the operation method for a program of a three-dimensional flash memory may comprise the steps of: applying a program voltage to a selected word line corresponding to a target memory cell for program operation from among word lines; floating each of unselected word lines other than the selected word line from among the word lines; applying a pass voltage to a back gate of a selected vertical channel structure including the target memory cell from among vertical chan- (Continued)

nel structures; and performing program operation on the target memory cell, in response to the application of the program voltage to the selected word line, the floating of each of the unselected word lines, and the application of the pass voltage to the back gate.

7 Claims, 8 Drawing Sheets

(51) Int. Cl.

| | |
|---|---|
| *G11C 11/56* | (2006.01) |
| *G11C 16/04* | (2006.01) |
| *G11C 16/08* | (2006.01) |
| *G11C 16/14* | (2006.01) |
| *G11C 16/24* | (2006.01) |

(52) U.S. Cl.
CPC ...... *G11C 11/2275* (2013.01); *G11C 11/5657* (2013.01); *G11C 16/0483* (2013.01); *G11C 16/08* (2013.01); *G11C 16/10* (2013.01); *G11C 16/14* (2013.01); *G11C 16/24* (2013.01)

(58) Field of Classification Search
CPC ..... G11C 16/0483; G11C 16/08; G11C 16/10; G11C 16/14; G11C 16/24; G11C 11/221; H10B 43/27
See application file for complete search history.

(56) References Cited

U.S. PATENT DOCUMENTS

| | | | |
|---|---|---|---|
| 2017/0076808 A1 | 3/2017 | Sakui | |
| 2020/0381061 A1* | 12/2020 | Jung ................... | G11C 11/5642 |
| 2021/0398593 A1 | 12/2021 | Song et al. | |
| 2022/0013533 A1* | 1/2022 | Or-Bach ............... | H10B 43/40 |

OTHER PUBLICATIONS

Written Opinion of International Search Authority issued from the WIPO dated Apr. 28, 2023 for the PCT International Application No. PCT/KR2023/000995.

* cited by examiner

FIG. 4

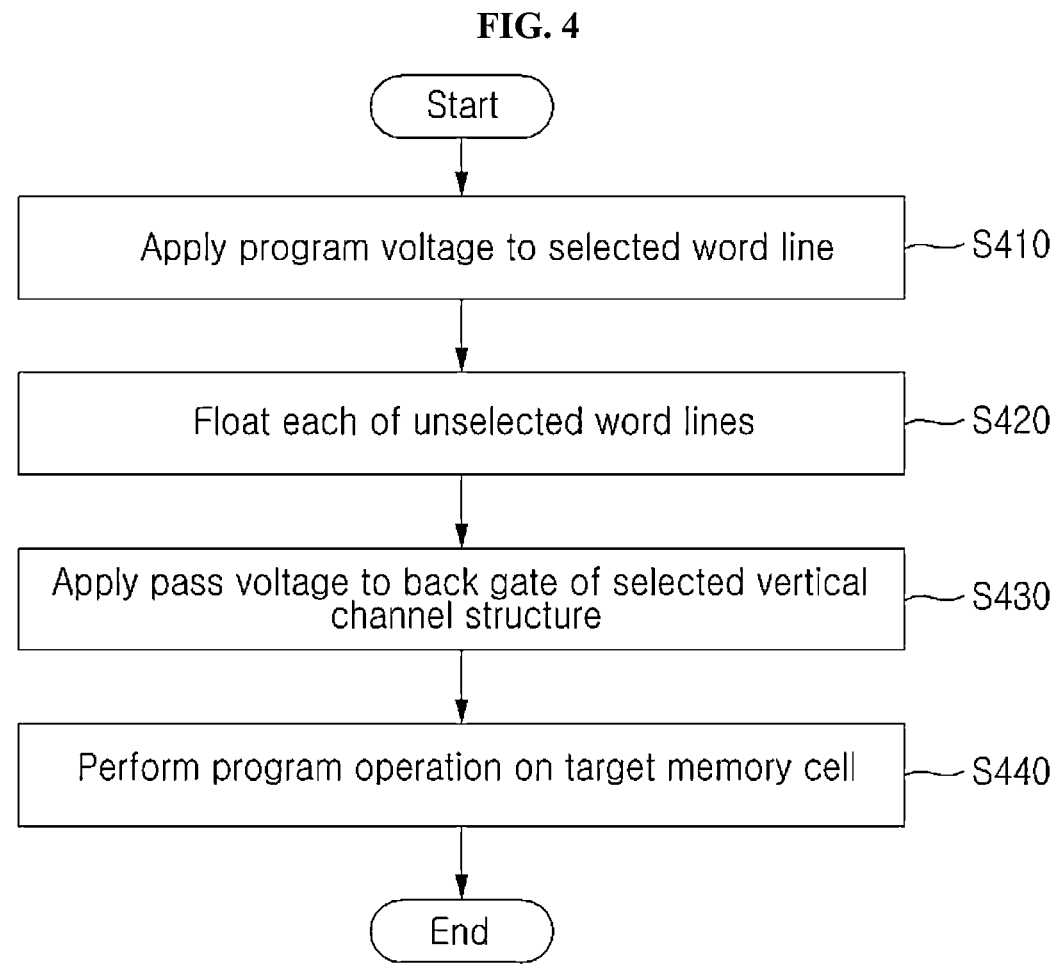

```
            ( Start )
               │
               ▼
┌────────────────────────────────────┐
│ Apply program voltage to selected  │──── S410
│             word line              │
└────────────────────────────────────┘
               │
               ▼
┌────────────────────────────────────┐
│  Float each of unselected word     │──── S420
│             lines                  │
└────────────────────────────────────┘
               │
               ▼
┌────────────────────────────────────┐
│ Apply pass voltage to back gate of │──── S430
│ selected vertical channel structure│
└────────────────────────────────────┘
               │
               ▼
┌────────────────────────────────────┐
│ Perform program operation on target│──── S440
│            memory cell             │
└────────────────────────────────────┘
               │
               ▼
            ( End )
```

Figure 5:
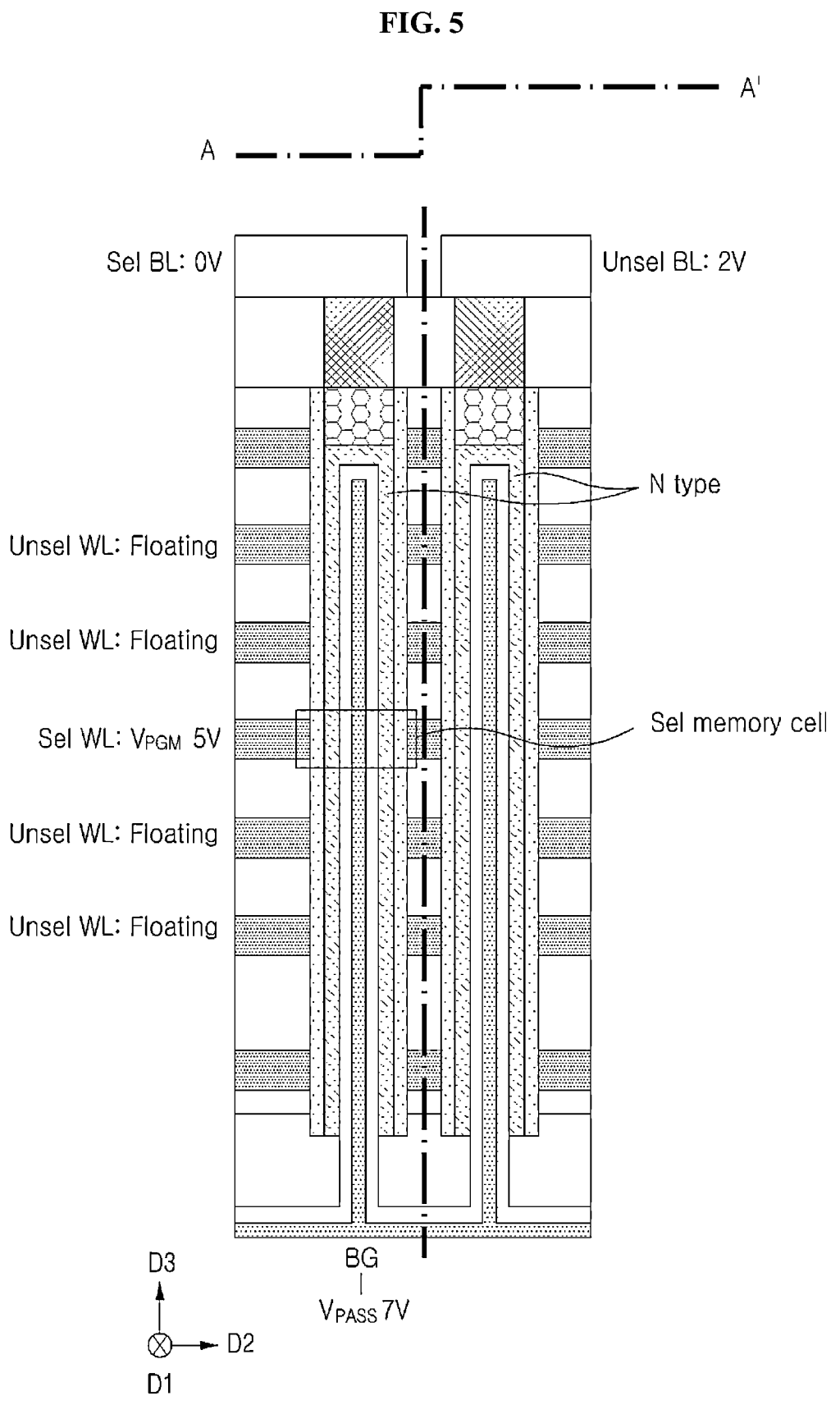

Sel BL: 0V

Unsel BL: 2V

N type

Unsel WL: Floating

Unsel WL: Floating

Sel WL: V$_{PGM}$ 5V

Sel memory cell

Unsel WL: Floating

Unsel WL: Floating

D3

D2

D1

BG

V$_{PASS}$ 7V

Start

Apply erasure voltage for generating GIDL to bit line of each of vertical channel structures —— S710

Apply ground voltage to each of word lines —— S720

Float back gate of each of vertical channel structures —— S730

Perform erasure operation on memory cells of each of vertical channel structures —— S740

End

FIG. 8

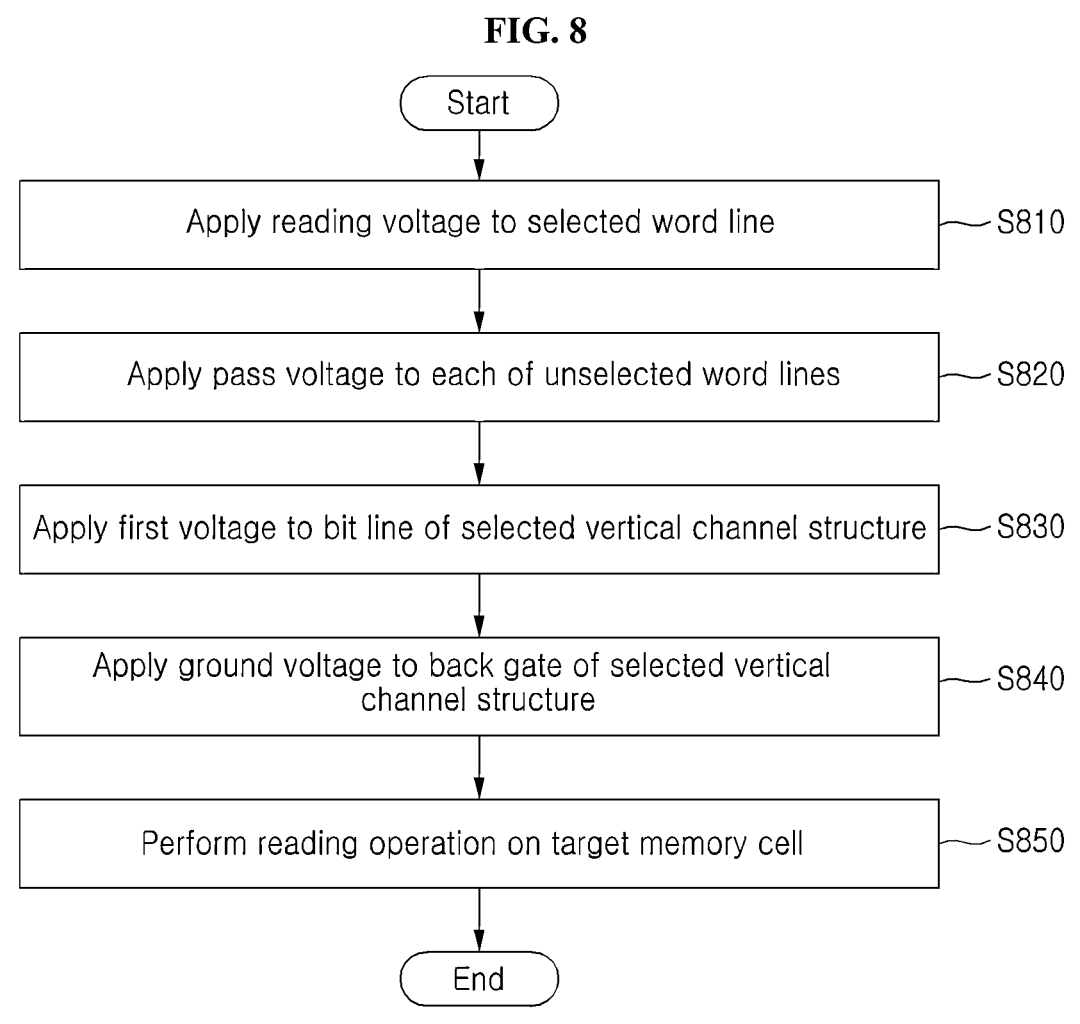

Start

Apply reading voltage to selected word line — S810

Apply pass voltage to each of unselected word lines — S820

Apply first voltage to bit line of selected vertical channel structure — S830

Apply ground voltage to back gate of selected vertical channel structure — S840

Perform reading operation on target memory cell — S850

End

OPERATION METHOD FOR THREE-DIMENSIONAL FLASH MEMORY INCLUDING FERROELECTRIC-BASED DATA STORAGE PATTERN AND BACK GATE

CROSS-REFERENCE TO RELATED APPLICATION

This application is a continuation of pending PCT International Application No. PCT/KR2023/000995, which was filed on Jan. 20, 2023, and which claims priority to Korean Patent Application No. 10-2022-0017916 which was filed in the Korean Intellectual Property Office on Feb. 11, 2022. The disclosures of which are hereby incorporated by reference in their entireties.

TECHNICAL FIELD

The following embodiments relate to a method of operating a three-dimensional flash memory, and more particularly, to a technology for a method of operating a three-dimensional flash memory including a ferroelectric-based data storage pattern and a back gate.

BACKGROUND ART

A flash memory element that is an electrically erasable programmable read only memory (EEPROM) electrically controlling data input/output through an F-N (Fowler-Nordheim) tunneling or a hot electron injection may be used in common in a computer, a digital camera, an MP3 player, a game system, a memory stick, etc.

In this flash memory element, it is required to increase an integration degree in order to satisfy excellent performance and low price required by consumers. Thus, a three dimensional structure in which memory cell transistors are vertically arranged to constitute a memory cell string CSTR is proposed.

In the three-dimensional flash memory, since the recent trend is to reduce a cross-sectional area of the memory cell string CSTR for integration, a technology in which a single film made of a ferroelectric material is used instead of a blocking oxide-nitride-tunnel oxide ONO used as a data storage pattern DSP has been proposed.

However, research and development on a method of operating a three-dimensional flash memory using the data storage pattern DSP based on ferroelectric is insufficient.

Meanwhile, a structure in which a back gate BG is disposed on an inner wall of a vertical channel pattern VCP is proposed to solve the problem that, during a program operation, the program operation of a target memory cell (Sel memory cell) is disturbed by a pass voltage $V_{PASS}$ applied to each of unselected word lines (Unsel WLs) adjacent to a selected word line (Sel WL) of the target memory cell (Sel memory cell).

However, research and development on the method of operating the three-dimensional flash memory having a back gate (BG) structure is also insufficient.

Accordingly, in the following embodiments, the method of operating the three-dimensional flash memory including the ferroelectric-based data storage pattern DSP and the back gate BG is proposed.

DETAILED DESCRIPTION OF THE INVENTION

Technical Problem

Embodiments propose a method of operating a three-dimensional flash memory including the ferroelectric-based data storage pattern DSP and a back gate BG to solve a problem that a program operation of the target memory cell (Sel memory cell) is disturbed by the pass voltage $V_{PASS}$ applied to each of the unselected word lines (Unsel WLs) while improving horizontal scaling.

However, technical problems to be solved by the present disclosure are not limited to the above problems and may be variously expanded without departing from the technical spirit and scope of the present disclosure.

Technical Solution

According to an embodiment, there is provided a method of operating a program of a three-dimensional flash memory including word lines formed to extend in a horizontal direction on a substrate, spaced apart from each other in a vertical direction, and laminated and vertical channel structures passing through the word lines and extending in the vertical direction, wherein each of the vertical channel structures includes a vertical channel pattern formed to extend in the vertical direction, a back gate formed to cover an inner wall of the vertical channel pattern and extend in the vertical direction, and a ferroelectric-based data storage pattern formed to cover an outer wall of the vertical channel pattern, and the data storage pattern and the vertical channel pattern constitute memory cells corresponding to the word lines, the method including applying a program voltage to a selected word line corresponding to a target memory cell that is a target of a program operation among the word lines, floating each of unselected word lines except for the selected word line among the word lines, applying a pass voltage to a back gate of a selected vertical channel structure including the target memory cell among the vertical channel structures, and performing the program operation on the target memory cell in response to the program voltage being applied to the selected word line, the unselected word lines being floating, and the pass voltage being applied to the back gate.

According to an aspect, the method may further include applying a voltage for self-boosting a vertical channel pattern of an unselected vertical channel structure to a bit line of the unselected vertical channel structure not including the target memory cell among the vertical channel structures.

According to another aspect, when the vertical channel pattern of the selected vertical channel structure including the target memory cell is of an N type, the applying of the program voltage to the selected word line may include applying a positive program voltage, and the applying of the pass voltage to the back gate of the selected vertical channel structure may include applying a positive pass voltage.

According to still another aspect, when the vertical channel pattern of the selected vertical channel structure including the target memory cell is of a P type, the applying of the program voltage to the selected word line may include applying a negative program voltage, and the applying of the pass voltage to the back gate of the selected vertical channel structure may include applying a negative pass voltage.

According to an embodiment, there is provided a method of erasing a three-dimensional flash memory including word lines formed to extend in a horizontal direction on a substrate, spaced apart from each other in a vertical direction, and laminated and vertical channel structures passing through the word lines and extending in the vertical direction, wherein each of the vertical channel structures includes a vertical channel pattern formed to extend in the vertical direction, a back gate formed to cover an inner wall of the vertical channel pattern and extend in the vertical direction, and a ferroelectric-based data storage pattern formed to cover an outer wall of the vertical channel pattern, and the data storage pattern and the vertical channel pattern constitute memory cells corresponding to the word lines, the method including applying an erasure voltage for generating gate induced drain leakage (GIDL) with respect to a string selection line (SSL) to a bit line of each of vertical channel structures included in a block that is a target of an erasure operation among the vertical channel structures, applying a ground voltage to each of the word lines, floating a back gate of each of the vertical channel structures included in the block, and performing the erasure operation on memory cells of each of the vertical channel structures included in the block in response to the GIDL being generated in each of the vertical channel structures included in the block.

According to an aspect, when the vertical channel pattern of each of the vertical channel structures included in the block is of an N type, the applying of the erasure voltage may include applying a positive erasure voltage.

According to another aspect, when the vertical channel pattern of each of the vertical channel structures included in the block is of a P type, the applying of the erasure voltage may include applying a negative erasure voltage.

Advantageous Effects of the Invention

Embodiments propose a method of operating a three-dimensional flash memory including the ferroelectric-based data storage pattern DSP and the back gate BG, thereby improving horizontal scaling while solving a problem that a program operation of the target memory cell (Sel memory cell) is disturbed by the pass voltage $V_{PASS}$ applied to each of the unselected word lines (Unsel WLs).

However, effects of the present disclosure are not limited to the above effects and may be variously expanded without departing from the technical spirit and scope of the present disclosure.

DESCRIPTION OF THE DRAWINGS

FIG. 4 is a flowchart illustrating a program operating method of the three-dimensional flash memory according to an embodiment.

FIGS. 5 and 6 are cross-sectional views illustrating a structure of the three-dimensional flash memory to describe the program operating method illustrated in FIG. 4.

FIG. 8 is a flowchart illustrating a reading operating method of the three-dimensional flash memory according to an embodiment.

BEST MODE

Figure 1:
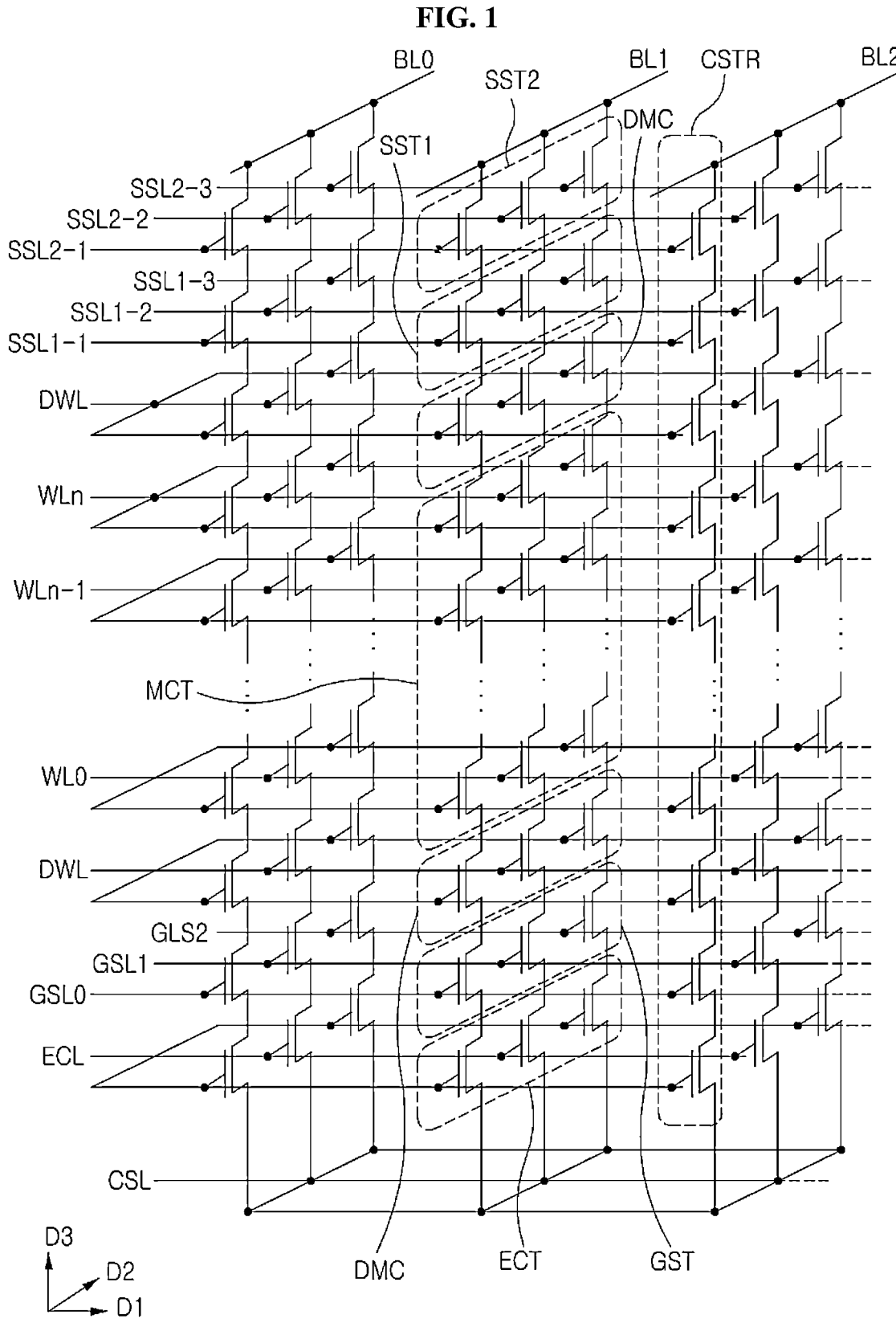
FIG. 1 is a schematic circuit diagram illustrating an array of a three-dimensional flash memory according to an embodiment.

Hereinafter, embodiments of the present disclosure will be described in detail with reference to the accompanying drawing. However, the present disclosure is not restricted or limited by the embodiments. Further, the same reference numerals in each drawing indicate the same components.

Further, terms used in the specification are used to properly express the embodiments of the present disclosure, and the terms may change depending on the intention of a viewer or an operator or customs in the field to which the present disclosure belongs. Therefore, definitions of these terms should be made based on the content throughout the specification. For example, in the specification, a singular form also includes a plural form unless specifically mentioned in a phrase. Further, the term "comprise" and/or "comprising" used herein does not exclude the presence or addition of one or more other components, steps, operations, and/or elements in or to components, steps, operations, and/or elements mentioned above. Further, even though the terms such as first and second are used in the specification to describe various areas, directions, and shapes, the areas, directions, and shapes should not be limited by these terms. These terms are merely used to distinguish one area, direction or shape from another area, direction or shape. Thus, a portion/part referred to as a "first part/portion" in an embodiment may be referred to as a "second part/portion" in another embodiment.

Further, it should be understood that various embodiments of the present disclosure are different from each other but are not necessarily mutually exclusive. For example, specific shapes, specific structures, and specific characteristics described herein may be implemented in another embodiment without departing from the technical spirit and scope of the present disclosure in relation to the embodiment. Further, it should be understood that positions, arrangements, or configurations of individual components in the range of each presented embodiment may be changed without departing from the technical spirit and scope of the present disclosure.

Hereinafter, a method of operating a three-dimensional flash memory including the ferroelectric-based data storage pattern DSP and the back gate BG will be described in detail with reference to the accompanying drawings.

FIG. 1 is a schematic circuit diagram illustrating an array of a three-dimensional flash memory according to an embodiment.

Referring to FIG. 1, the array of the three-dimensional flash memory according to the embodiment may include a common source line CSL, a plurality of bit lines BL0, BL1, and BL2, and a plurality of cell strings CSTR arranged between the common source line CSL and the bit lines BL0, BL1, and BL2.

The bit lines BL0, BL1, and BL2 may be two-dimensionally arranged while being spaced apart from each other in a first direction D1 while extending in a second direction D2. Here, the first direction D1, the second direction D2, and a third direction D3 may be orthogonal to each other and may form a rectangular coordinate system defined by X, Y, and Z axes.

The plurality of cell strings CSTR may be connected in parallel to the bit lines BL0, BL1, and BL2, respectively. The cell strings CSTR may be commonly connected to the common source line CSL while being provided between the bit lines BL0, BL1, and BL2 and the one common source line CSL. In this case, a plurality of common source lines CSL may be provided, and the plurality of common source lines CSL may be two-dimensionally arranged while being spaced apart from each other in the second direction D2 while extending in the first direction D1. The same voltage may be electrically applied to the plurality of common source lines CSL, but the present disclosure is not restricted or limited thereto, and different voltages may be applied to the plurality of common source lines CSL as the plurality of common source lines CSL are electrically independently controlled.

The cell strings CSTR may be arranged spaced apart from each other in the second direction D2 for each bit line while extending in the third direction D3. According to an embodiment, each of the cell strings CSTR may include a ground selection transistor GST connected to the common source line CSL, first and second string selection transistors SST1 and SST2 connected to the bit lines BL0, BL1, and BL2 and connected in series to each other, memory cell transistors MCT arranged between the ground selection transistor GST and the first and second string selection transistors SST1 and SST2 and connected in series to each other, and an erasure control transistor ECT. Further, each of the memory cell transistors MCT may include a data storage element.

As an example, each of the cell strings CSTR may include the first and second string selection transistors SST1 and SST2 connected in series to each other, and the second string selection transistor SST2 may be connected to one of the bit lines BL0, BL1, and BL2. However, the present disclosure is not restricted or limited thereto, and each of the cell strings CSTR may include one string selection transistor. As another example, the ground selection transistor GST in each of the cell strings CSTR may include a plurality of metal oxide semiconductor (MOS) transistors connected in series to each other, which is similar to the first and second string selection transistors SST1 and SST2.

The one cell string CSTR may include the plurality of memory cell transistors MCT having different distances from the common source lines CSL. That is, the memory cell transistors MCT may be connected in series to each other while being arranged between the first string selection transistor SST1 and the ground selection transistor GST in the third direction D3. The erasure control transistor ECT may be connected between the ground selection transistor GST and the common source lines CSL. Each of the cell strings CSTR may further include dummy cell transistors DMC connected between the first string selection transistor SST1 and an uppermost one of the memory cell transistors MCT and between the ground selection transistor GST and a lowermost one of the memory cell transistors MCT.

According to the embodiment, the first string selection transistor SST1 may be controlled by first string selection lines SSL1-1, SSL1-2, and SSL1-3, and the second string selection transistor SST2 may be controlled by second string selection lines SSL2-1, SSL2-2, and SSL2-3. The memory cell transistors MCT may be respectively controlled by a plurality of word lines WL0 to WLn, and the dummy cell transistors DMC may be respectively controlled by dummy word lines DWL. The ground selection transistor GST may be controlled by ground selection lines GSL0, GSL1, and GSL2, and the erasure control transistor ECT may be controlled by an erasure control line ECL. A plurality of erasure control transistors ECT may be provided. The common source lines CSL may be commonly connected to sources of the erasure control transistors ECT.

Gate electrodes of the memory cell transistors MCT, which are provided at substantially the same distance from the common source lines CSL, may be commonly connected to one of the word lines WL0 to WLn and DWL and thus may be in an equipotential state. However, the present disclosure is not restricted or limited thereto, and even when the gate electrodes of the memory cell transistors MCT are provided at substantially the same level from the common source lines CSL, the gate electrodes provided in different rows or columns may be independently controlled.

The ground selection lines GSL0, GSL1, and GSL2, the first string selection lines SSL1-1, SSL1-2, and SSL1-3, and the second string selection lines SSL2-1, SSL2-2, and SSL2-3 may be two-dimensionally arranged while extending in the first direction D1 and being spaced apart from each other in the second direction D2. The ground selection lines GSL0, GSL1, and GSL2, the first string selection lines SSL1-1, SSL1-2, and SSL1-3, and the second string selection lines SSL2-1, SSL2-2, and SSL2-3, which are provided at substantially the same level from the common source lines CSL, may be electrically separated from each other. Further, the erasure control transistors ECT of different cell strings CSTR may be controlled by the common erasure control line ECL. The erasure control transistors ECT may generate gate induced drain leakage (hereinafter, referred to as GIDL) during an operation of erasing a memory cell array. In some embodiments, during the operation of erasing the memory cell array, an erasure voltage may be applied to the bit lines BL0, BL1, and BL2 and/or the common source lines CSL, and a gate induced leakage current may be generated in the string selection transistor SST and/or the erasure control transistors ECT.

The string selection line SSL may be expressed as an upper selection line USL, and the ground selection line GSL may be expressed as a lower selection line.

Figure 2:
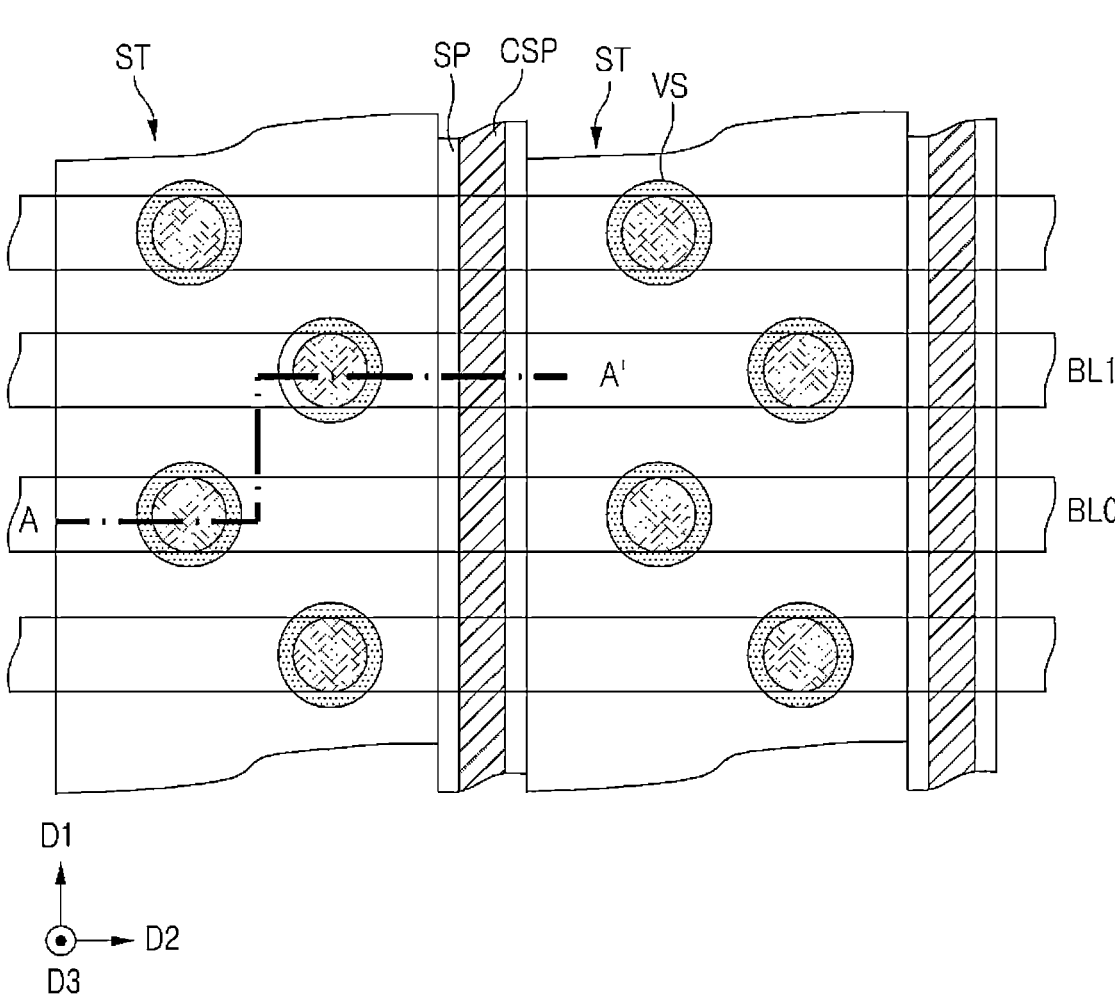
FIG. 2 is a plan view illustrating a structure of the three-dimensional flash memory according to an embodiment.
Figure 3:
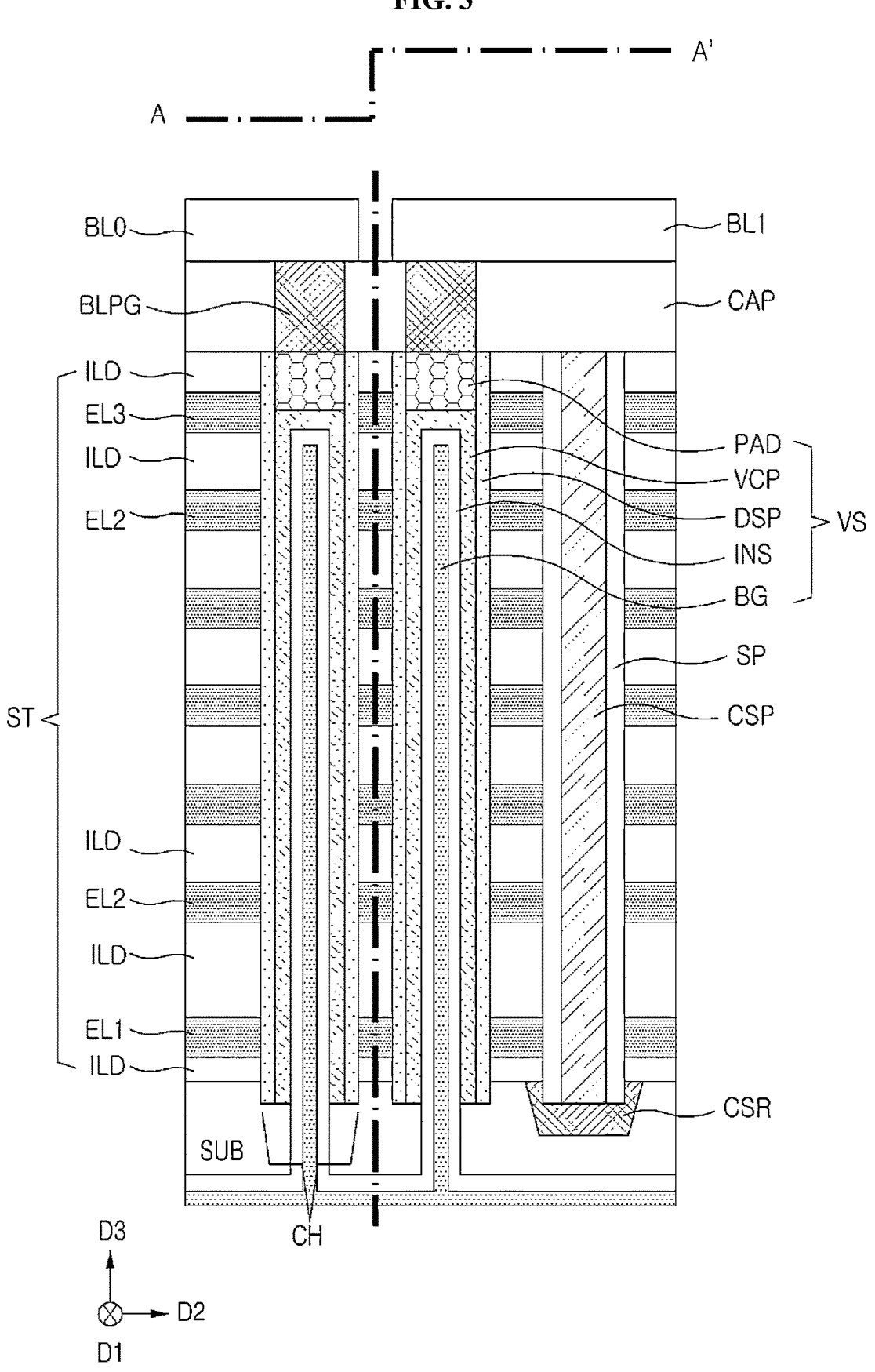
FIG. 3 is a cross-sectional view illustrating the structure of the three-dimensional flash memory according to an embodiment and corresponds to a cross section along line A-A' of FIG. 2.

FIG. 2 is a plan view illustrating a structure of the three-dimensional flash memory according to the embodiment, and FIG. 3 is a cross-sectional view illustrating the structure of the three-dimensional flash memory according to the embodiment and corresponds to a cross section along line A-A' of FIG. 2.

Referring to FIGS. 2 and 3, a substrate SUB may be a semiconductor substrate such as a silicon substrate, a silicon-germanium substrate, a germanium substrate, or a monocrystalline epitaxial layer grown on a monocrystalline silicon substrate. The substrate SUB may be doped with first conductivity-type impurities (e.g., P-type impurities).

Laminated structures ST may be arranged on the substrate SUB. The laminated structures ST may be two-dimensionally arranged in the second direction D2 while extending in the first direction D1. Further, the laminated structures ST may be spaced apart from each other in the second direction D2.

Each of the laminated structures ST may include gate electrodes EL1, EL2, and EL3 alternately laminated in a vertical direction perpendicular to an upper surface of the substrate SUB (e.g., in the third direction D3), and interlayer insulating films ILD. The laminated structures ST may have substantially flat upper surfaces. That is, the upper surfaces of the laminated structures ST may be parallel to the upper surface of the substrate SUB. Hereinafter, the vertical direction means the third direction D3 or a direction opposite to the third direction D3.

Referring back to FIG. 1, each of the gate electrodes EL1, EL2, and EL3 may be one of the erasure control line ECL, the ground selection lines GSL0, GSL1, and GSL2, the word lines WL0 to WLn and DWL, the first string selection lines SSL1-1, SSL1-2, and SSL1-3, and the second string selection lines SSL2-1, SSL2-2, and SSL2-3 that are sequentially laminated on the substrate SUB.

Each of the gate electrodes EL1, EL2, and EL3 may have substantially the same thickness in the third direction D3 while extending in the first direction D1. Hereinafter, the thickness means a thickness in the third direction D3. Each of the gate electrodes EL1, EL2, and EL3 may be formed of a conductive material. For example, each of the gate electrodes EL1, EL2, and EL3 may include at least one selected from a doped semiconductor (e.g., a doped silicon or the like), a metal (e.g., W (tungsten), Cu (copper), Al (aluminum), Ti (titanium), Ta (tantalum), Mo (molybdenum), Ru (ruthenium), Au (gold), or the like), a conductive metal nitride (e.g., a titanium nitride, a tantalum nitride, or the like) or the like. Each of the gate electrodes EL1, EL2, and EL3 may include at least one of all metal materials that may be formed by ALD in addition to the metal material described above.

In more detail, the gate electrodes EL1, EL2, and EL3 may include the lowermost first gate electrode EL1, the uppermost third gate electrode EL3, and the plurality of second gate electrodes EL2 between the first gate electrode EL1 and the third gate electrode EL3. Although each of the first gate electrode EL1 and the third gate electrode EL3 is illustrated and described in a singular number, this is illustrative, and the present disclosure is not limited thereto. As needed, the plurality of first gate electrodes EL1 and the plurality of third gate electrodes EL3 may also be provided. The first gate electrode EL1 may correspond to one of the ground selection lines GSL0, GSL1, and GSL2 illustrated in FIG. 1. The second gate electrode EL2 may correspond to any one of the word lines WL0 to WLn and DWL illustrated in FIG. 1. The third gate electrode EL3 may correspond to any one of the first string selection lines SSL1-1, SSL1-2, and SSL1-3 or any one of the second string selection lines SSL2-1, SSL2-2, and SSL2-3 illustrated in FIG. 1.

Although not illustrated, an end of each of the laminated structures ST may have a stepwise structure in the first direction D1. In more detail, the lengths of the gate electrodes EL1, EL2, and EL3 of the laminated structures ST in the first direction D1 may decrease as a distance from the substrate SUB increases. The third gate electrode EL3 may have the smallest length in the first direction D1 and the largest distance from the substrate SUB in the third direction D3. The first gate electrode EL1 may have the largest length in the first direction D1 and the smallest distance from the substrate SUB in the third direction D3. Due to the stepwise structure, the thickness of each of the laminated structures ST may decrease as the distance from the outermost one of vertical channel structures VS, which will be described below, increases, and the side walls of the gate electrodes EL1, EL2, and EL3 may be spaced apart from each other at regular intervals in the first direction D1 when viewed from a plane.

The interlayer insulating films ILD may have different thicknesses. As an example, the lowermost one and the uppermost one of the interlayer insulating films ILD may have a thickness that is smaller than those of the other interlayer insulating films ILD. However, this is illustrative, and the present disclosure is not limited thereto. The interlayer insulating films ILD may be set to have different thickness or the same thickness according to characteristics of a semiconductor device. The interlayer insulating films ILD may be formed of an insulating material to insulate the gate electrodes EL1, EL2, and EL3 from each other. As an example, the interlayer insulating films ILD may be formed of a silicon oxide.

A plurality of channel holes CH passing through portions of the laminated structures ST and the substrate SUB may be provided. The vertical channel structures VS may be provided in the channel holes CH. The vertical channel structures VS, which are the plurality of cell strings CSTR illustrated in FIG. 1, may extend in the third direction D3 while being connected to the substrate SUB. The connection of the vertical channel structures VS with the substrate SUB may be achieved as a lower surface of a portion of each of the vertical channel structures VS is in contact with the upper surface of the substrate SUB, but the present disclosure is not restricted or limited thereto, and the connection of the vertical channel structures VS with the substrate SUB may be achieved as the vertical channel structures VS are buried in the substrate SUB. When portions of the vertical channel structures VS are buried in the substrate SUB, lower surfaces of the vertical channel structures VS may be positioned at a lower level than that of the upper surface of the substrate SUB.

A plurality of columns of the vertical channel structures VS passing through any one of the laminated structures ST may be provided. For example, as illustrated in FIG. 2, the columns of the two vertical channel structures VS may pass through one of the laminated structures ST. However, the present disclosure is not restricted or limited thereto. For example, the columns of the three or more vertical channel structures VS may pass through one of the laminated structures ST. In a pair of adjacent columns, the vertical channel structures VS corresponding to one column may be shifted in the first direction D1 from the vertical channel structures VS corresponding to the other column adjacent thereto. When viewed from a plane, the vertical channel structures VS may be arranged in a zigzag shape in the first direction D1. However, the present disclosure is not restricted or limited thereto, and the vertical channel structures VS may form an array in which the vertical channel structures VS are arranged side by side in rows and columns.

Each of the vertical channel structures VS may be formed to extend from the substrate SUB in the third direction D3. In the drawing, each of the vertical channel structures VS is illustrated as having a column shape having the same width at an upper end and a lower end thereof, but the present disclosure is not restricted or limited thereto, and each of the vertical channel structures VS may have a shape of which widths in the first direction D1 and the second direction D2 increase toward the third direction D3. An upper surface of each of the vertical channel structures VS may have a circular shape, an elliptical shape, a quadrangular shape, or a bar shape.

Each of the vertical channel structures VS may include the data storage pattern DSP, a vertical channel pattern VCP, the back gate BG, and a conductive pad PAD. In each of the vertical channel structures VS, the data storage pattern DSP and the vertical channel pattern VCP may have a pipe shape or a macaroni shape having an open lower end, and the back gate BG may have a shape that fills an inner space of the vertical channel pattern VCP while at least a portion thereof is surrounded by the vertical channel pattern VCP.

While covering inner walls of the channel holes CH, the data storage pattern DSP may inwardly surround an outer wall of the vertical channel pattern VCP and may be outwardly in contact with the side walls of the gate electrodes EL1, EL2, and EL3. Accordingly, areas of the data storage pattern DSP, which correspond to the second gate electrodes EL2, together with areas of the vertical channel pattern VCP, which correspond to the second gate electrodes EL2, may constitute memory cells in which a memory operation (e.g., a program operation, a reading operation, or an erasure operation) is performed by voltages applied through the second gate electrodes EL2. The memory cells correspond to the memory cell transistors MCT illustrated in FIG. 1. To this end, the data storage pattern DSP may be formed of a ferroelectric material to represent data values of charges in the polarization state by the voltages applied through the second gate electrodes EL2. As an example, the ferroelectric-based data storage pattern DSP may represent binary data values or multi-valued data values of the charges in the polarization state. Hereinafter, the ferroelectric material may include at least one of $HfO_x$, $Pb(Zr, Ti)O_3$, (PZT), $PbTiO_3$ (PTO), $SrBi_2Ti_2O_3$ (SBT), $Bi(La, Ti)O_3$ (BLT), $Pb(La, Zr)TiO_3$ (PLZT), $Bi(Sr, Ti)O_3$ (BST), barium titanate ($BaTiO_3$), P(VDF-TrFE), PVDF, $AlO_x$, $ZnO_x$, $TiO_x$, $TaO_x$ or $InO_x$ that is doped with at least one material of $HfO_x$, Al, Zr or Si having an orthorhombic crystal structure.

The vertical channel pattern VCP may cover the inner side wall of the data storage pattern DSP and may extend in the third direction D3. The vertical channel pattern VCP may be provided between the data storage pattern DSP and the back gate BG and may constitute the memory cells together with areas of the data storage pattern DSP, which correspond to the second gate electrodes EL2.

The upper surface of the vertical channel pattern VCP may be positioned to be higher in level than the upper surface of the uppermost one of the second gate electrodes EL2. In more detail, the upper surface of the vertical channel pattern VCP may be positioned between the upper surface and the lower surface of the third gate electrode EL3.

The vertical channel pattern VCP, which is a component for transferring charges or holes to the data storage pattern DSP, may be formed of monocrystalline silicon or polysilicon such that the channel is formed or boosted by the voltage applied thereto. However, the present disclosure is not restricted or limited thereto. For example, the vertical channel pattern VCP may be formed of an oxide semiconductor material capable of blocking, suppressing, or minimizing a leakage current. For example, the vertical channel pattern VCP may be formed of an oxide semiconductor material including at least one of In, Zn, and Ga having excellent leakage current characteristics, or a group 4 semiconductor material. The vertical channel pattern VCP may be formed of, for example, a $ZnO_x$-based material including AZO, ZTO, IZO, ITO, IGZO, or Ag—ZnO. Thus, the vertical channel pattern VCP may block, suppress, or minimize a leakage current to the gate electrodes EL1, EL2, and EL3 or the substrate SUB, may improve transistor characteristics (e.g., a threshold voltage distribution and a program/read operation speed) of at least one of the gate electrodes EL1, EL2, and EL3, and as a result, may improve electrical characteristics of the three-dimensional flash memory.

The back gate BG may be in contact with the vertical channel pattern VCP, with at least a portion thereof surrounded by the vertical channel pattern VCP, and may be formed to apply a voltage to the vertical channel pattern VCP for the memory operation. To this end, the back gate BG may be formed of a conductive material including at least one selected from the group of doped semiconductor (e.g., doped silicon, etc.), metal (e.g., tungsten (W), copper (Cu), aluminum (Al), titanium (Ti), tantalum (Ta), molybdenum (Mo), ruthenium (Ru), gold (Au), etc.), or conductive metal nitride (e.g., titanium nitride, tantalum nitride, etc.). The back gate BG may include at least one of all metal materials capable of being formed by ALD, in addition to the above-described metal materials.

In this case, the back gate BG may be formed to extend in the third direction D3 in the vertical channel pattern VCP from a level corresponding to the first gate electrode EL1 to a level corresponding to the second gate electrode EL2. That is, the upper surface of the back gate BG may be positioned to be higher in level than the upper surface of the uppermost one of the second gate electrodes EL2. However, the present disclosure is not restricted or limited thereto. For example, the back gate BG may be formed to extend in the third direction D3 in the vertical channel pattern VCP to a level corresponding to the third gate electrode EL3.

A lower substrate in contact with the lower portion of the back gate BG is omitted in the drawing, but depending on an implementation example, the lower substrate in contact with the lower surface of the back gate BG may be included. Further, depending on the implementation example, the back gate BG may be formed from an interior of the substrate SUB or may be formed from an upper portion of the substrate SUB.

The back gate BG may be included in the vertical channel pattern VCP of each of the cell strings CSTR, and all the back gates BG respectively included in the vertical channel patterns VCP of the cell strings CSTR may be electrically connected on a plane formed by the first direction D1 and the second direction D2. That is, the back gate BG may be connected in common to the cell strings CSTR. In this case, the back gates BG of the cell strings CSTR may be collectively controlled such that the same voltage may be applied to all the back gates BG.

However, the present disclosure is not restricted or limited thereto. For example, the back gates BG respectively included in the vertical channel patterns VCP of the cell strings CSTR may be electrically connected to each other in the first direction D1 of FIG. 1. In this case, the back gates BG of the cell strings CSTR arranged in the second direction D2 may be electrically controlled independently of each other such that different voltages may be applied to the back gates BG, and the back gates BG of the cell strings CSTR arranged in the first direction D1 of FIG. 1 may be collectively controlled such that the same voltage may be applied to the back gates BG.

Further, the back gates BG respectively included in the vertical channel patterns VCP of the cell strings CSTR may be electrically connected to each other in the second direction D2 of FIG. 1. In this case, the back gates BG of the cell strings CSTR arranged in the first direction D1 may be electrically controlled independently of each other such that different voltages are applied to the back gates BG, and the back gates BG of the cell strings CSTR arranged in the second direction D2 of FIG. 1 may be collectively controlled such that the same voltage is applied to the back gates BG.

An insulating film INS may be disposed between the back gate BG and the vertical channel pattern VCP, and thus, the back gate BG may be prevented from being in direct contact with the vertical channel pattern VCP. The insulating film INS may be formed of an insulating material such as a silicon oxide, which is similar to the interlayer insulating films ILD. However, the insulating film INS may be omitted depending on the implementation example.

A structure in which the back gate BG is formed in an internal hole of the vertical channel pattern VCP and is formed in a state of being closely surrounded by the vertical channel pattern VCP is described above, but the present disclosure is not restricted or limited thereto. For example, a structure in which only at least a portion of the back gate BG may be surrounded by the vertical channel pattern VCP may be formed. For example, a structure in which the back gate BG and the insulating film INS are included in at least a portion of the vertical channel pattern VCP or a structure in which the back gate BG and the insulating film INS penetrate the vertical channel pattern VCP may be implemented.

The back gate BG having this structure may be used to apply a voltage to change and maintain states of charges of the ferroelectric-based data storage pattern DSP in a memory operation (e.g., the program operation, the erasure operation, and the reading operation) of the three-dimensional flash memory. Accordingly, a voltage applied to the back gate BG causes the memory operation of the three-dimensional flash memory together with voltages applied to the word lines WL0 to WLn and voltages applied to the bit lines BL0 to BL1 connected to the vertical channel structures VS. Thus, the three-dimensional flash memory according to the embodiment further uses the back gate BG in addition to the word lines WL0 to WLn and the bit lines BL0 to BL1 in the memory operation, and thus a memory operation speed is increased, and cell characteristics and reliability may be improved. A detailed description thereof will be made below.

Referring back to FIG. 1, the vertical channel structures VS may correspond to channels of the erasure control transistor ECT, the first and second string selection transistors SST1 and SST2, the ground selection transistor GST, and the memory cell transistors MCT.

The conductive pad PAD may be provided on the upper surface of the vertical channel pattern VCP. The conductive pad PAD may be connected to an upper portion of the vertical channel pattern VCP. A side wall of the conductive pad PAD may be surrounded by the data storage pattern DSP. An upper surface of the conductive pad PAD may be substantially coplanar with an upper surface of each of the laminated structures ST (i.e., an upper surface of the uppermost one of the interlayer insulating films ILD). A lower surface of the conductive pad PAD may be positioned at a lower level than that of an upper surface of the third gate electrode EL3. In more detail, the lower surface of the conductive pad PAD may be positioned between the upper surface and the lower surface of the third gate electrode EL3. That is, at least a portion of the conductive pad PAD may overlap the third gate electrode EL3 in a horizontal direction.

The conductive pad PAD may be formed of a semiconductor doped with impurities or a conductive material. For example, the conductive pad PAD may be formed of a semiconductor material doped with impurities different from that of the substrate SUB (in detail, impurities of a second conductive type (e.g., N-type) different from the first conductive type (e.g., P-type)).

The conductive pad PAD may reduce a contact resistance between the bit line BL, which will be described below, and the vertical channel pattern VCP.

A separation trench TR extending in the first direction D1 may be provided between the adjacent laminated structures ST. A common source area CSR may be provided inside the substrate SUB exposed by the separation trench TR. The common source area CSR may extend in the first direction D1 within the substrate SUB. The common source area CSR may be formed of a semiconductor material doped with the second conductive type impurities (e.g., the N-type impurities). The common source area CSR may correspond to the common source line CSL of FIG. 1.

A common source plug CSP may be provided inside the separation trench TR. The common source plug CSP may be connected to the common source area CSR. The upper surface of the common source plug CSP may be substantially coplanar with the upper surface of each of the laminated structures ST (i.e., the upper surface of the uppermost one of the interlayer insulating films ILD). The common source plug CSP may have a plate shape extending in the first direction D1 and the third direction D3. In this case, the common source plug CSP may have a shape of which a width in the second direction D2 increases toward the third direction D3.

Insulation spacers SP may be interposed between the common source plug CSP and the laminated structures ST. The insulation spacers SP may be provided between the adjacent laminated structures ST to face each other. For example, the insulation spacers SP may be formed of a silicon oxide, a silicon nitride, a silicon oxy nitride, or a low-k material having a low dielectric constant.

A capping insulating film CAP may be provided on the laminated structures ST, the vertical channel structures VS, and the common source plug CSP. The capping insulating film CAP may cover the upper surface of the uppermost one of the interlayer insulating films ILD, the upper surface of the conductive pad PAD, and the upper surface of the common source plug CSP. The capping insulating film CAP may be formed of an insulating material different from that of the interlayer insulating films ILD. A bit line contact plug BLPG electrically connected to the conductive pad PAD may be provided inside the capping insulating film CAP. The bit line contact plug BLPG may have a shape of which widths in the first direction D1 and the second direction D2 increase toward the third direction D3.

The bit line BL may be provided on the capping insulating film CAP and the bit line contact plug BLPG. The bit line BL corresponds to any one of the plurality of bit lines BL0, BL1, and BL2 illustrated in FIG. 1 and may be formed of a conductive material to extend in the second direction D2. The conductive material constituting the bit line BL may be the same material as the conductive material forming each of the gate electrodes EL1, EL2, and EL3.

The bit line BL may be electrically connected to the vertical channel structures VS through the bit line contact plug BLPG. Here, the fact that the bit line BL is connected to the vertical channel structures VS may mean that the bit line BL is connected to the vertical channel patterns VCP included in the vertical channel structures VS.

The three-dimensional flash memory according to the embodiment is not limited or restricted to the above-described structure and may be implemented in various structures as long as the three-dimensional flash memory includes the vertical channel pattern VCP, the ferroelectric-based data storage pattern DSP, the back gate BG, the gate electrodes EL1, EL2, and EL3, the bit line BL, and the common source line CSL according to the implementation example.

Figure 6:
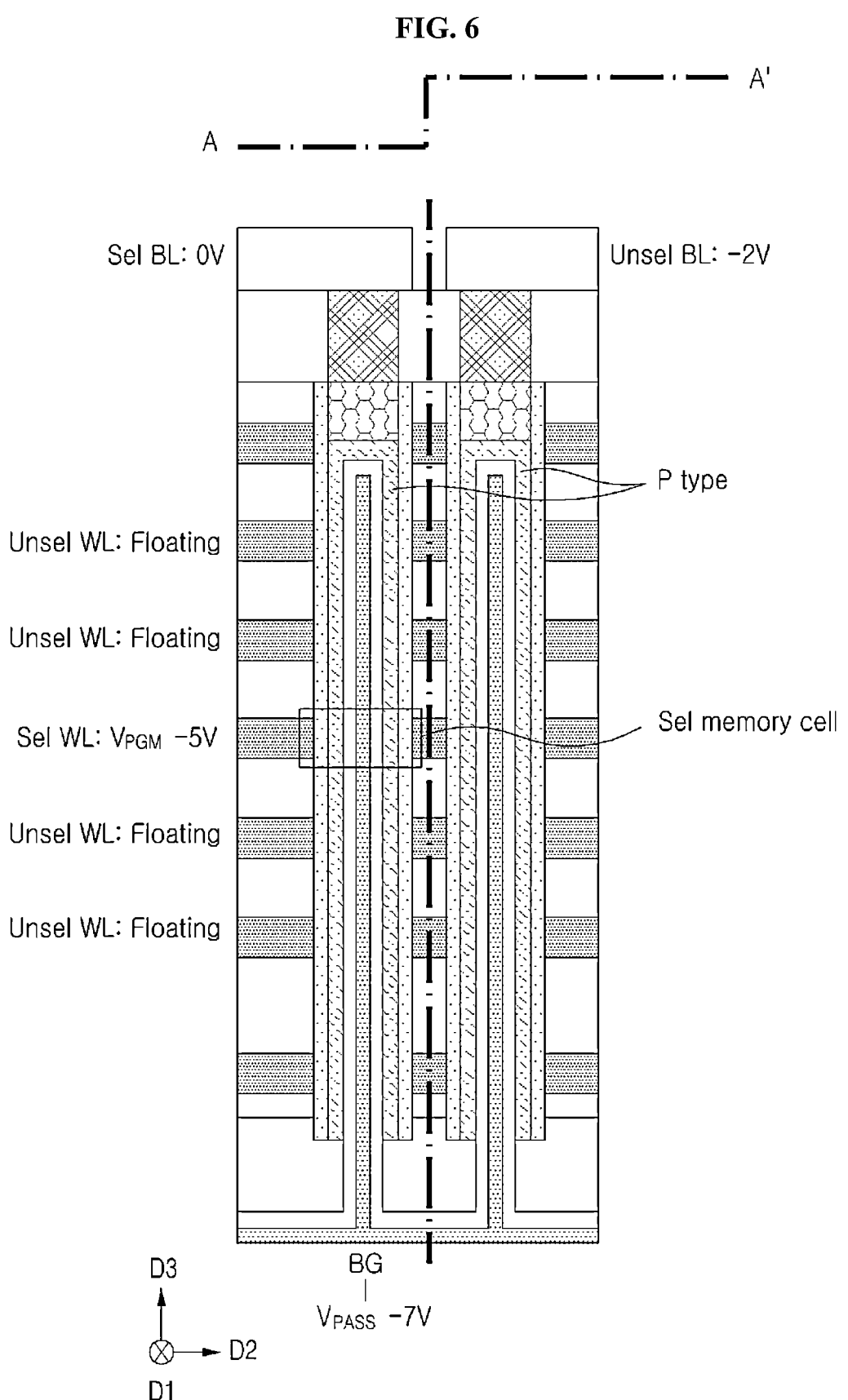

FIG. 4 is a flowchart illustrating a program operating method of the three-dimensional flash memory according to the embodiment, and FIGS. 5 and 6 are cross-sectional views illustrating a structure of the three-dimensional flash memory to describe the program operating method illustrated in FIG. 4. In more detail, FIG. 5 is a cross-sectional view illustrating the structure of the three-dimensional flash memory to describe the program operating method when the vertical channel pattern is an N type, and FIG. 6 is a cross-sectional view illustrating the structure of a three-dimensional flash memory to describe the program operating method when the vertical channel pattern is a P type.

Hereinafter, the described program operating method is assumed to be performed by the three-dimensional flash memory having the structure described above with reference to FIGS. 1 to 3.

Referring to FIG. 4, in operation S410, the three-dimensional flash memory may apply a program voltage $V_{PGM}$ to a selected word line (Sel WL) corresponding to a target memory cell (Sel memory cell) that is a target of the program operation among the word lines WL0 to WLn.

In operation S420, the three-dimensional flash memory may float each of unselected word lines (Unsel WLs) except for the selected word line (Sel WL) among the word lines WL0 to WLn.

In operation S430, the three-dimensional flash memory may apply the pass voltage $V_{PASS}$ to the back gate BG of the selected vertical channel structure (Sel VS) including the target memory cell (Sel memory cell) among the vertical channel structures VS.

In operation S440, the three-dimensional flash memory may perform the program operation for the target memory cell (Sel memory cell) in response to a state in which the program voltage $V_{PGM}$ is applied to the selected word line (Sel WL), each of the unselected word lines (Unsel WLs) floats, and the pass voltage $V_{PASS}$ is applied to the back gate BG.

In this way, instead of applying the pass voltage $V_{PASS}$ to each of the unselected word lines (Unsel WLs), the pass voltage $V_{PASS}$ is applied to the back gate BG, and thus a problem that the program operation of the target memory cell (Sel memory cell) is disturbed according to the pass voltage $V_{PASS}$ applied to each of the unselected word lines (Unsel WLs) may be solved.

The program operation according to each type of the vertical channel pattern VCP will be described in detail based on operations S410 to S440. As illustrated in FIG. 5, when the vertical channel pattern VCP is of N type, in operation S410, the three-dimensional flash memory may apply a positive program voltage $+V_{PGM}$ to the selected word line (Sel WL). The positive program voltage $+V_{PGM}$ may have a value between 5 V and 12 V. As an example, the positive program voltage $+V_{PGM}$ may have a value of 5 V. The three-dimensional flash memory may float each of the unselected word lines (Unsel WLs) in operation S420 and then apply a positive pass voltage $+V_{PASS}$ to the back gate BG of the selected vertical channel structure (Sel VS) in operation S430. The positive pass voltage $+V_{PASS}$ may have a value between 5 V and 10 V. As an example, the positive pass voltage $+V_{PASS}$ may have a value of 7 V.

In this case, in operation S430, the three-dimensional flash memory may apply a ground voltage (0V) to the bit line (Sel BL) connected to the selected vertical channel structure (Sel VS) including the target memory cell (Sel memory cell) among the vertical channel structures VS and apply a voltage (a positive power supply voltage $V_{CC}$; e.g., +2 V) that self-boosts the vertical channel pattern VCP of the unselected vertical channel structure (Unsel VS) to the bit line (Unsel BL) connected to the unselected vertical channel structure (Unsel VS) (a vertical channel structure not including the target memory cell (Sel memory cell)) except for the selected vertical channel structure (Sel VS) among the vertical channel structures VS.

Accordingly, the program operation for the target memory cell (Sel memory cell) may be performed in the vertical channel structures VS in which the vertical channel pattern VCP is of an N type.

On the other hand, as illustrated in FIG. 6, when the vertical channel pattern VCP is of a P type, in operation S410, the three-dimensional flash memory may apply a negative program voltage $-V_{PGM}$ to the selected word line (Sel WL). The negative program voltage $-V_{PGM}$ may have a value between $-12$ V and $-5$ V. As an example, the negative program voltage $-V_{PGM}$ may have a value of $-5$ V. The three-dimensional flash memory may float each of the unselected word lines (Unsel WLs) in operation S420 and then apply a negative pass voltage $-V_{PASS}$ to the back gate BG of the selected vertical channel structure (Sel VS) in operation S430. The negative pass voltage $-V_{PASS}$ may have a value between $-10$ V and $-5$ V. As an example, the negative pass voltage $-V_{PASS}$ may have a value of $-7$ V.

In this case, in operation S430, the three-dimensional flash memory may apply a ground voltage (0V) to the bit line (Sel BL) connected to the selected vertical channel structure (Sel VS) including the target memory cell (Sel memory cell) among the vertical channel structures VS and apply a voltage (a negative power supply voltage $V_{CC}$; e.g., $-2$ V) that self-boosts the vertical channel pattern VCP of the unselected vertical channel structure (Unsel VS) to the bit line (Unsel BL) connected to the unselected vertical channel structure (Unsel VS) (a vertical channel structure not including the target memory cell (Sel memory cell)) except for the selected vertical channel structure (Sel VS) among the vertical channel structures VS.

Accordingly, the program operation for the target memory cell (Sel memory cell) may be performed in the vertical channel structures VS in which the vertical channel pattern VCP is of an P type.

Figure 7:
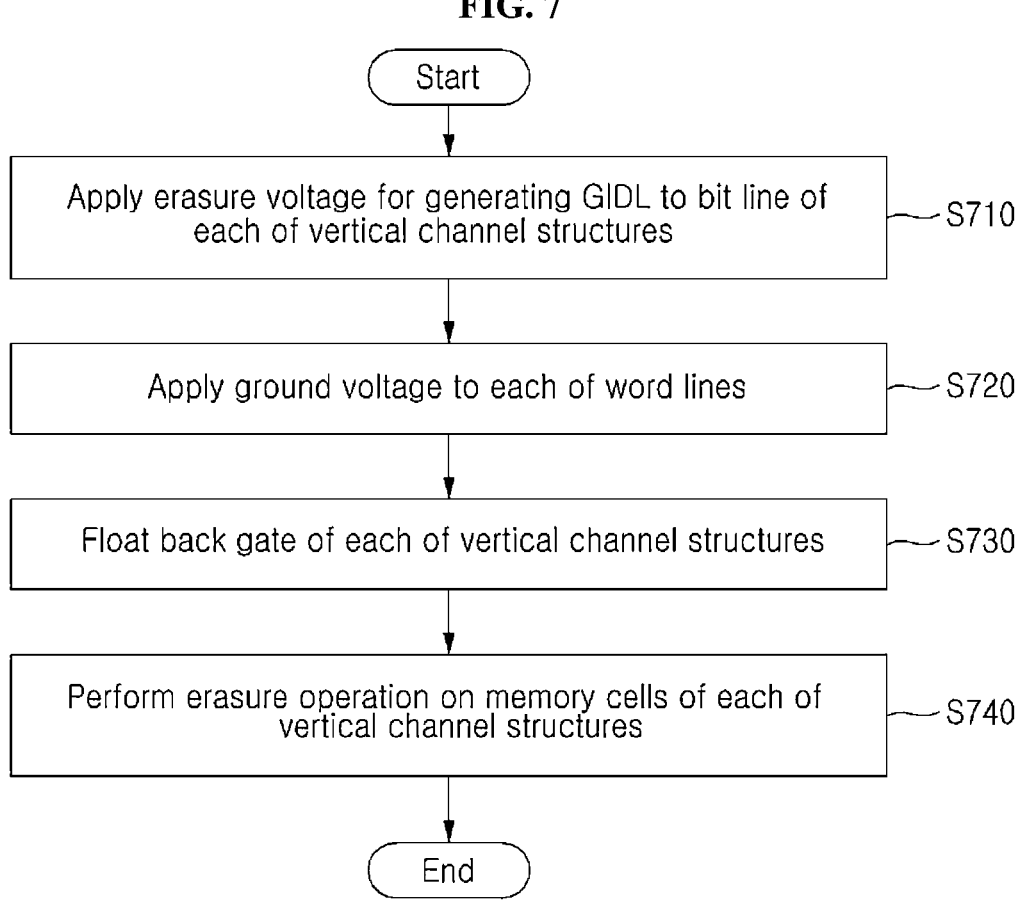
FIG. 7 is a flowchart illustrating an erasure operating method of the three-dimensional flash memory according to an embodiment.

FIG. 7 is a flowchart illustrating an erasure operating method of the three-dimensional flash memory according to the embodiment.

Hereinafter, the described erasure operating method is assumed to be performed by the three-dimensional flash memory having the structure described above with reference to FIGS. 1 to 3.

Referring to FIG. 7, in operation S710, the three-dimensional flash memory may apply an erasure voltage $V_{ERASE}$ for generating the GIDL with the string selection line SSL to the bit line BL of each of the vertical channel structures VS, which are included in a block that is a target of the erasure operation, among the vertical channel structures VS.

In operation S720, the three-dimensional flash memory may apply the ground voltage 0V to each of the word lines WL0 to WLn.

In operation S730, the three-dimensional flash memory may float the back gate BG of each of the vertical channel structures VS included in the block.

In operation S740, the three-dimensional flash memory may perform the erasure operation on memory cells of each of the vertical channel structures VS included in the block in response to the GIDL generated in each of the vertical channel structures VS included in the block.

The erasure operation according to each type of the vertical channel pattern VCP will be described in detail based on operations S710 to S740. When the vertical channel pattern VCP is of an N type, in operation S710, the three-dimensional flash memory may apply a positive erasure voltage $+V_{ERASE}$ to the bit line BL of each of the vertical channel structures VS included in the block that is a target of the erasure operation. The positive erasure voltage $+V_{ERASE}$ may have a value between 5 V and 12 V. As an example, the positive erasure voltage $+V_{ERASE}$ may have a value of 10 V. Accordingly, the erasure operation may be performed on the vertical channel structures VS in which the vertical channel pattern VCP is of an N type.

On the other hand, when the vertical channel pattern VCP is of a P type, in operation S710, the three-dimensional flash memory may apply a negative erasure voltage $-V_{ERASE}$ to the bit line BL of each of the vertical channel structures VS included in the block that is a target of the erasure operation. The negative erasure voltage $-V_{ERASE}$ may have a value between $-12$ V and $-5$ V. As an example, the negative erasure voltage $-V_{ERASE}$ may have a value of $-10$ V. Accordingly, the erasure operation may be performed on the vertical channel structures VS in which the vertical channel pattern VCP is of an P type.

FIG. 8 is a flowchart illustrating a reading operating method of the three-dimensional flash memory according to the embodiment.

Hereinafter, the described reading operating method is assumed to be performed by the three-dimensional flash memory having the structure described above with reference to FIGS. 1 to 3.

Referring to FIG. 8, in operation S810, the three-dimensional flash memory may apply a reading voltage $V_{READ}$ to the selected word line (Sel WL) corresponding to the target memory cell (Sel memory cell) that is a target of the reading operation among the word lines WL0 to WLn.

In operation S820, the three-dimensional flash memory may apply the pass voltage $V_{PASS}$ to each of the unselected word lines (Unsel WLs) except for the selected word line (Sel WL) among the word lines WL0 to WLn.

In operation S830, the three-dimensional flash memory may apply a first voltage $V_1$ to the bit line (Sel BL) of the selected vertical channel structure (Sel VS) including the target memory cell (Sel memory cell) among the vertical channel structures VS.

In operation S840, the three-dimensional flash memory may apply the ground voltage 0V to the back gate BG of the selected vertical channel structure (Sel VS) including the target memory cell (Sel memory cell) among the vertical channel structures VS.

In operation S850, the three-dimensional flash memory may perform the reading operation on the target memory cell (Sel memory cell) in response to the reading voltage $V_{READ}$ being applied to the selected word line (Sel WL), the pass voltage $V_{PASS}$ being applied to each of the unselected word lines (Unsel WLs), the first voltage $V_1$ being applied to the bit line (Sel BL) of the selected vertical channel structure (Sel VS), and the ground voltage 0V being applied to the back gate BG of the selected vertical channel structure (Sel VS).

The reading operation according to each type of the vertical channel pattern VCP will be described in detail based on operations S810 to S850. When the vertical channel pattern VCP is of N type, in operation S810, the three-dimensional flash memory may apply a positive reading voltage $+V_{READ}$ to the selected word line (Sel WL). In operation S820, the three-dimensional flash memory may apply the positive pass voltage $+V_{PASS}$ (e.g., $+2$ V) to each of the unselected word lines (Unsel WLs). Further, in operation S830, the three-dimensional flash memory may apply a positive first voltage $V_1$ (e.g., $+1$ V) to the bit line (Sel BL) of the selected vertical channel structure (Sel VS) including the target memory cell (Sel memory cell) among the vertical channel structures VS and may apply the ground voltage 0V to the bit line (Unsel VS) of the unselected vertical channel structure (Unsel VS) not including the target memory cell (Sel memory cell) among the vertical channel structures VS.

Accordingly, the reading operation for the target memory cell (Sel memory cell) may be performed in the vertical channel structures VS in which the vertical channel pattern VCP is of an N type.

On the other hand, when the vertical channel pattern VCP is of a P type, in operation S810, the three-dimensional flash memory may apply a negative reading voltage $-V_{READ}$ to the selected word line (Sel WL). In operation S820, the three-dimensional flash memory may apply the negative pass voltage $-V_{PASS}$ (e.g., $-2$ V) to each of the unselected word lines (Unsel WLs). Further, in operation S830, the three-dimensional flash memory may apply a negative first voltage $V_1$ (e.g., $-1$ V) to the bit line (Sel BL) of the selected vertical channel structure (Sel VS) including the target memory cell (Sel memory cell) among the vertical channel structures VS and may apply the ground voltage 0V to the bit line (Unsel VS) of the unselected vertical channel structure (Unsel VS) not including the target memory cell (Sel memory cell) among the vertical channel structures VS.

Accordingly, the reading operation for the target memory cell (Sel memory cell) may be performed in the vertical channel structures VS in which the vertical channel pattern VCP is of an P type.

As described above, although the embodiments have been described with reference to the limited embodiments and the limited drawings, various modifications and changes may be made based on the above description by those skilled in the art. For example, even though the described technologies are performed in an order different from the described method, and/or the described components such as a system, a structure, a device, and a circuit are coupled or combined in a form different from the described method or are replaced or substituted by other components or equivalents, appropriate results may be achieved.

Therefore, other implementations, other embodiments, and those equivalent to the appended claims also belong to the scope of the appended claims.

The invention claimed is:

1. A method of operating a program of a three-dimensional flash memory including word lines formed to extend in a horizontal direction on a substrate, spaced apart from each other in a vertical direction, and laminated and vertical channel structures passing through the word lines and extending in the vertical direction, wherein each of the vertical channel structures includes a vertical channel pattern formed to extend in the vertical direction, a back gate formed to cover an inner wall of the vertical channel pattern and extend in the vertical direction, and a ferroelectric-based data storage pattern formed to cover an outer wall of the vertical channel pattern, and the data storage pattern and the vertical channel pattern constitute memory cells corresponding to the word lines, the method comprising:

applying a program voltage to a selected word line corresponding to a target memory cell that is a target of a program operation among the word lines;

floating each of unselected word lines except for the selected word line among the word lines;

applying a pass voltage to a back gate of a selected vertical channel structure including the target memory cell among the vertical channel structures; and performing the program operation on the target memory cell in response to the program voltage being applied to the selected word line, the unselected word lines being floating, and the pass voltage being applied to the back gate.

2. The method of claim 1, further comprising:

applying a voltage for self-boosting a vertical channel pattern of an unselected vertical channel structure to a bit line of the unselected vertical channel structure not including the target memory cell among the vertical channel structures.

3. The method of claim 1, wherein, when the vertical channel pattern of the selected vertical channel structure including the target memory cell is of an N type, the applying of the program voltage to the selected word line includes applying a positive program voltage, and the applying of the pass voltage to the back gate of the selected vertical channel structure includes applying a positive pass voltage.

4. The method of claim 1, wherein, when the vertical channel pattern of the selected vertical channel structure including the target memory cell is of a P type, the applying of the program voltage to the selected word line includes applying a negative program voltage, and the applying of the pass voltage to the back gate of the selected vertical channel structure includes applying a negative pass voltage.

5. A method of erasing a three-dimensional flash memory including word lines formed to extend in a horizontal direction on a substrate, spaced apart from each other in a vertical direction, and laminated and vertical channel structures passing through the word lines and extending in the vertical direction, wherein each of the vertical channel structures includes a vertical channel pattern formed to extend in the vertical direction, a back gate formed to cover an inner wall of the vertical channel pattern and extend in the vertical direction, and a ferroelectric-based data storage pattern formed to cover an outer wall of the vertical channel pattern, and the data storage pattern and the vertical channel pattern constitute memory cells corresponding to the word lines, the method comprising:

applying an erasure voltage for generating gate induced drain leakage (GIDL) with respect to a string selection line (SSL) to a bit line of each of vertical channel structures included in a block that is a target of an erasure operation among the vertical channel structures;

applying a ground voltage to each of the word lines;

floating a back gate of each of the vertical channel structures included in the block; and performing the erasure operation on memory cells of each of the vertical channel structures included in the block in response to the GIDL being generated in each of the vertical channel structures included in the block.

6. The method of claim 5, wherein, when the vertical channel pattern of each of the vertical channel structures included in the block is of an N type, the applying of the erasure voltage includes applying a positive erasure voltage.

7. The method of claim 5, wherein, when the vertical channel pattern of each of the vertical channel structures included in the block is of a P type, the applying of the erasure voltage includes applying a negative erasure voltage.

* * * * *